(12) United States Patent
Zabroda

(10) Patent No.: US 12,170,509 B2
(45) Date of Patent: Dec. 17, 2024

(54) SAMPLING AND HOLDING ELECTRICAL SIGNALS WITH RAIL-TO-RAIL EQUIVALENT OUTPUT SWING

(71) Applicant: Cisco Technology, Inc., San Jose, CA (US)

(72) Inventor: Oleksiy Zabroda, Constable, NY (US)

(73) Assignee: Cisco Technology, Inc., San Jose, CA (US)

( * ) Notice: Subject to any disclaimer, the term of this patent is extended or adjusted under 35 U.S.C. 154(b) by 2 days.

(21) Appl. No.: 18/178,394

(22) Filed: Mar. 3, 2023

(65) Prior Publication Data
US 2024/0297626 A1     Sep. 5, 2024

(51) Int. Cl.
*H03F 3/45*     (2006.01)

(52) U.S. Cl.
CPC .................................. *H03F 3/45475* (2013.01)

(58) Field of Classification Search
None
See application file for complete search history.

(56) References Cited

U.S. PATENT DOCUMENTS

| | | |
|---|---|---|
| 7,126,431 B2 * | 10/2006 | Mintchev ............. H03H 11/265 327/246 |
| 8,198,937 B1 | 6/2012 | Vilas Boas et al. |
| 10,734,090 B2 | 8/2020 | Zabroda |
| 2014/0070971 A1 | 3/2014 | Zabroda |
| 2019/0296756 A1 | 9/2019 | Ali |
| 2020/0005882 A1 | 1/2020 | Zabroda |
| 2021/0104986 A1 | 4/2021 | Chang et al. |

* cited by examiner

*Primary Examiner* — Jeffrey S Zweizig
(74) *Attorney, Agent, or Firm* — Patterson + Sheridan, LLP

(57) ABSTRACT

A sample and hold circuit providing rail-to rail equivalent output is described. The circuit includes a sample and hold amplifier containing two separate sets of sampling capacitors, one set is coupled to a PMOS transistor differential stage and the other set is coupled to an NMOS transistor differential stage. The differential stages drive a current mirror based push-pull output differential stage to provide an output signal with ranges equivalent to a rail-to rail output signal swing.

19 Claims, 6 Drawing Sheets

US 12,170,509 B2

SAMPLING AND HOLDING ELECTRICAL SIGNALS WITH RAIL-TO-RAIL EQUIVALENT OUTPUT SWING

TECHNICAL FIELD

Certain embodiments of the disclosure relate to electronic signal processing. More specifically, embodiments described herein provide for a bottom plate sample and hold circuit with an extended equivalence to a rail-to-rail output swing.

BACKGROUND

Sampling signals is a process used in many electrical integrated circuits (ICs) where the conversion of analog signals into a digital format is required. Specialized sample and hold amplifiers are often used in circuits performing sampling analog input signals. The constant progress in semiconductor technology is accompanied by a decrease in the operating voltages. Additionally, the parameters of metal-oxide semiconductor (MOS) transistors are more adapted for digital rather than analog applications. This often leads to a reduction of available headroom of active transistors and analog signals range. To compensate for the degradation in signal-to-noise ratio caused by the thermal noise of the circuit components, the operating current of the circuit components is generally increased inversely with the square of the signal amplitude. This results in a significant power loss. Thus, it is necessary to further reduce power consumption and improve the signal-to-noise ratio in sampling circuits. One possible way to achieve this goal is to build a sample-and-hold circuit capable of handling virtually rail-to-rail signal range.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
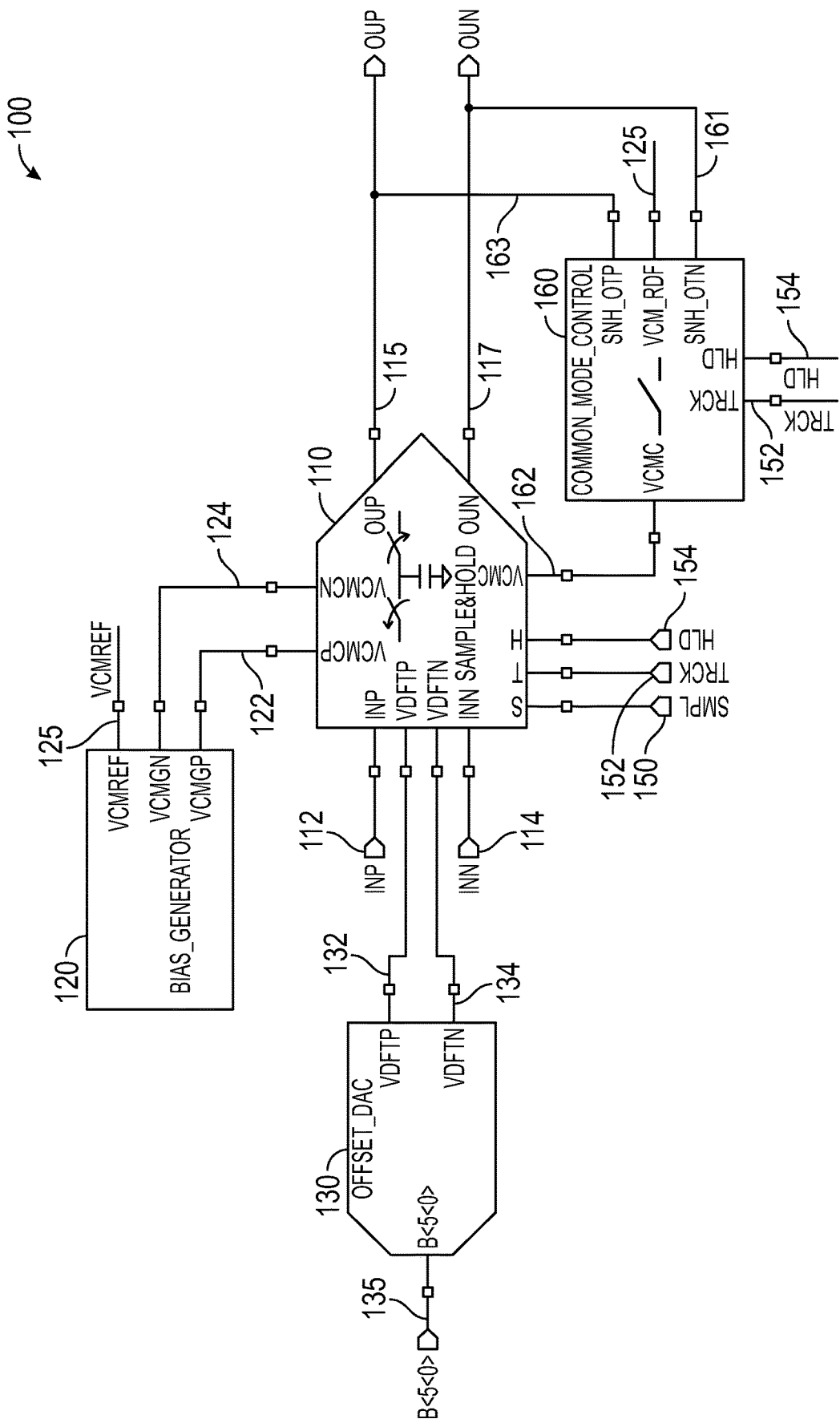
FIG. 1 is a block diagram of a sample and hold circuit with extended output, in accordance with an example embodiment of the disclosure.

One general aspect includes a circuit for sampling and holding electrical signals. The circuit includes a sample and hold amplifier which may include: a first input node; a first output node; at least two capacitors, where each capacitor of the at least two capacitors may include a bottom plate and a top plate, where each respective top plate is coupled to the first input node and the first output node. The circuit also includes a first PMOS transistor which includes: a gate node connected to a bottom plate of a first capacitor of the at least two capacitors; and a drain node coupled to an input node of a first current mirror, where an output of the first current mirror is coupled to the first output node of the sample and hold amplifier. The circuit also includes a first NMOS transistor which includes: a gate node connected to a bottom plate of a second capacitor of the at least two capacitors; and a drain node coupled to an input node of a second current mirror, where an output of the second current mirror is coupled to the first output node of the sample and hold amplifier.

One general aspect includes a method for sampling and holding an electrical signal. The method includes at first time enabling a tracking mode in a sample and hold amplifier by: shunting together the gate nodes of an NMOS transistor differential stage and shunting together the gate nodes of a PMOS transistor differential stage using a first set of switches; coupling together top plates from a set of sampling capacitors to at least one input node of the sample and hold amplifier, where bottom plates of the set of sampling capacitors are connected to different gates of the NMOS transistor and PMOS transistor differential stages; disabling a first set of PMOS transistor current mirrors driven by a NMOS transistor differential stage; and disabling a first set of NMOS transistor current mirrors driven by the PMOS transistor differential stage; and at second time enabling a holding mode in the sample and hold amplifier by: opening the first set of switches, disconnecting the set of sampling capacitors from the at least one input node; enabling the first set of PMOS transistor current mirrors; enabling the first set of NMOS transistor current mirrors; coupling a first subset of the first set of sampling capacitors to at least one output of the sample and hold amplifier to provide a holding output signal; and coupling a second subset of the sampling capacitors to at least one voltage source.

One general aspect includes a circuit for sampling and holding electrical signals. The circuit includes a sample and hold amplifier, which includes a PMOS transistor differential stage, and an NMOS transistor differential stage. The circuit configured to perform a method including: at first time enabling a tracking mode in the sample and hold amplifier by: shunting together the gate nodes of an NMOS transistor differential stage and shunting together the gate nodes of a PMOS transistor differential stage using a first set of switches; coupling together top plates from a set of sampling capacitors to at least one input node of the sample and hold amplifier, where bottom plates of the set of sampling capacitors are connected to different gate nodes of the NMOS and PMOS transistor differential stages; disabling a first set of PMOS transistor current mirrors driven by the NMOS transistor differential stage; and disabling a first set of NMOS transistor current mirrors driven by the PMOS transistor differential stage; and at second time enabling a holding mode in the sample and hold amplifier by: opening the first set of switches, disconnecting the set of sampling capacitors from the at least one input node; enabling the first set of PMOS transistor current mirrors; enabling the first set of NMOS transistor current mirrors; coupling a first subset of the first set of sampling capacitors to at least one output of the sample and hold amplifier to provide a holding output signal; and coupling a second subset of the sampling capacitors to at least one voltage source.

Example Embodiments

As described above sampling electrical signals in an integrated circuit (IC) presents many challenges includes resource/power usage intensity as well as potential for errors in the sampled signals caused by noise and nonlinear distortions. Several developments in the sample and hold circuit designs have been explored.

For example, a bottom plate sampling technique is advantageous in several ways. The bottom plate sampling circuit typically includes an amplifier, a sampling capacitor, the bottom plate of which is directly coupled with the inverting input of the amplifier and the first terminal of a bottom plate switch, the other terminal of which is connected to a virtual ground. The top plate of the sampling capacitor is coupled to two switches: the first terminal of a first switch (top plate switch), the other terminal of which is connected to the input of the sampling circuit, and the first terminal of a second switch (feedback switch), the other terminal of which is coupled to the output node of the amplifier and the sampling circuit output. During a tracking mode of the sample and hold circuit, the top and the bottom plate switches are closed and the sampling capacitor tracks the input signal. At the moment of sampling, the bottom plate switch opens first. Then the sampling capacitor also is disconnected from the input signal node and is connected to the amplifier output. During the settling of the amplifier output, the input node of the amplifier returns to a zero voltage. In some examples, the return to zero voltage cancels a charge accumulated by the sampling capacitor during a time interval where the bottom switch was already opened but the capacitor was still connected to the input node.

In some examples, the bottom plate sampling technique may be improved by using a push-pull differential amplifier. A push-pull differential amplifier includes connected back-to-back NMOS and PMOS transistors, the gate nodes of which are connected to the inverting input of the amplifier, the drain nodes connected to the amplifier output and at least one source node is connected to a bias current source. This topology provides a double transconductance for the same amount of the bias current. In some examples, the output signal swing for the amplifier is limited due to a variation of the parameters of the MOS transistors (e.g., the threshold voltage). To address this limitation, push-pull differential amplifier often utilizes an elevated power supply resulting in diminished power efficiency.

In another example, the sampling capacitors in the push-pull differential amplifier described above are split in two halves. During the tracking mode, the bottom plates of the capacitors and the gates of the NMOS and PMOS transistors are coupled to different sources of a bias voltage. The separate bias voltages are separate tracking processes, including voltage and temperature (PVT) variations of the amplifier PMOS and NMOS transistors. Those values of the bias gate voltages are preserved during the holding mode of the push-pull differential amplifier, which provides a headroom for the amplifier core transistors independent of the transistor parameter variation, but the available headroom may still be limited by the voltage allocated for the bias current source.

The topology of the push-pull differential amplifier provides a greater output signal swing independent of any transistor parameter variations. In some examples, the presence of the bias current source prevents operating the amplifier core transistors in a rail-to-rail mode (i.e., an entire range from a maximum voltage of a power line (VCC) to a related minimum voltage (GND) and thus limits the achievable output signal swing of the differential amplifier. Maximizing an amplifier output signal swing improves a signal to noise ratio (SNR) and the power consumption of the sampling circuit and consecutive blocks that receive the sampled output, which are typically analog to digital converters operating in a time interleaved mode.

Further increase of the output signal swing to reach a rail-to rail equivalent output, is achieved in the sample and hold circuits described herein in relation to FIGS. 1-6.

FIG. 1 is a block diagram of system 100 including a sample and hold amplifier 110, in accordance with an example embodiment of the disclosure. The amplifier 110 receives input signals including INP 112 and INN 114 and produces holding output signals including OUP 115 and OUN 117. In some examples and as described in greater detail herein, the amplifier 110 receives the INP 112 and INN 114 during a tracking/sampling mode and generates outputs, OUP 115 and OUN 117, during a holding mode. The amplifier 110 may include a plurality of switches, capacitors, and gain stages. In some examples, the amplifier 110 is a part of an integrated circuit (IC). In an example scenario, the amplifier 110 includes differential input stages and push-pull output stages, as described further with respect to FIGS. 3-4, and may be enabled to track an input signal charging a plurality of capacitors, switching the capacitors from the input signal to the output of the differential amplifier for holding the sampled value.

In some examples, the system 100 includes several components connected to the amplifier 110 to assist the amplifier 110 in the various tracking and holding modes. For example, the system 100 includes bias generator 120, offset compensation digital to analog converter (DAC) 130, and common mode voltage control circuit 160.

The bias generator 120 produces a common-mode voltage reference (VCMREF) signal 125 which is used to control the system output common mode voltage during the holding mode of operation, and bias voltages including VCMGP 122 and VCMGN 124, which are utilized by the amplifier 110 as described herein in relation to FIGS. 2-6. The offset compensation DAC 130 uses control bits 135 to produce offset compensation inputs VOFFP 132 and VOFFN 134, which are utilized by the amplifier 110 as described herein in relation to FIGS. 2-5. The system output common mode voltage control circuit 160, uses the VCMREF signal 125 and sampled amplifier outputs SnH_OUTP 163 and SnH_OUTN 161 to provide a common mode control output voltage (VCMC) 162 to the amplifier 110 during a holding mode as described in more detail in relation to FIGS. 3-5.

In some examples in the system 100, including the amplifier 110, the transition from a tracking/sampling mode to a holding mode is controlled by clock signals, such as sampling clock signal 150, tracking clock signal 152, and holding clock signal 154. In some examples, the amplifier 110 and the other components of system 100 are controlled by clock signals having a timing relationship according to an offset timing signal scheme as shown in FIG. 2.

Figure 2:
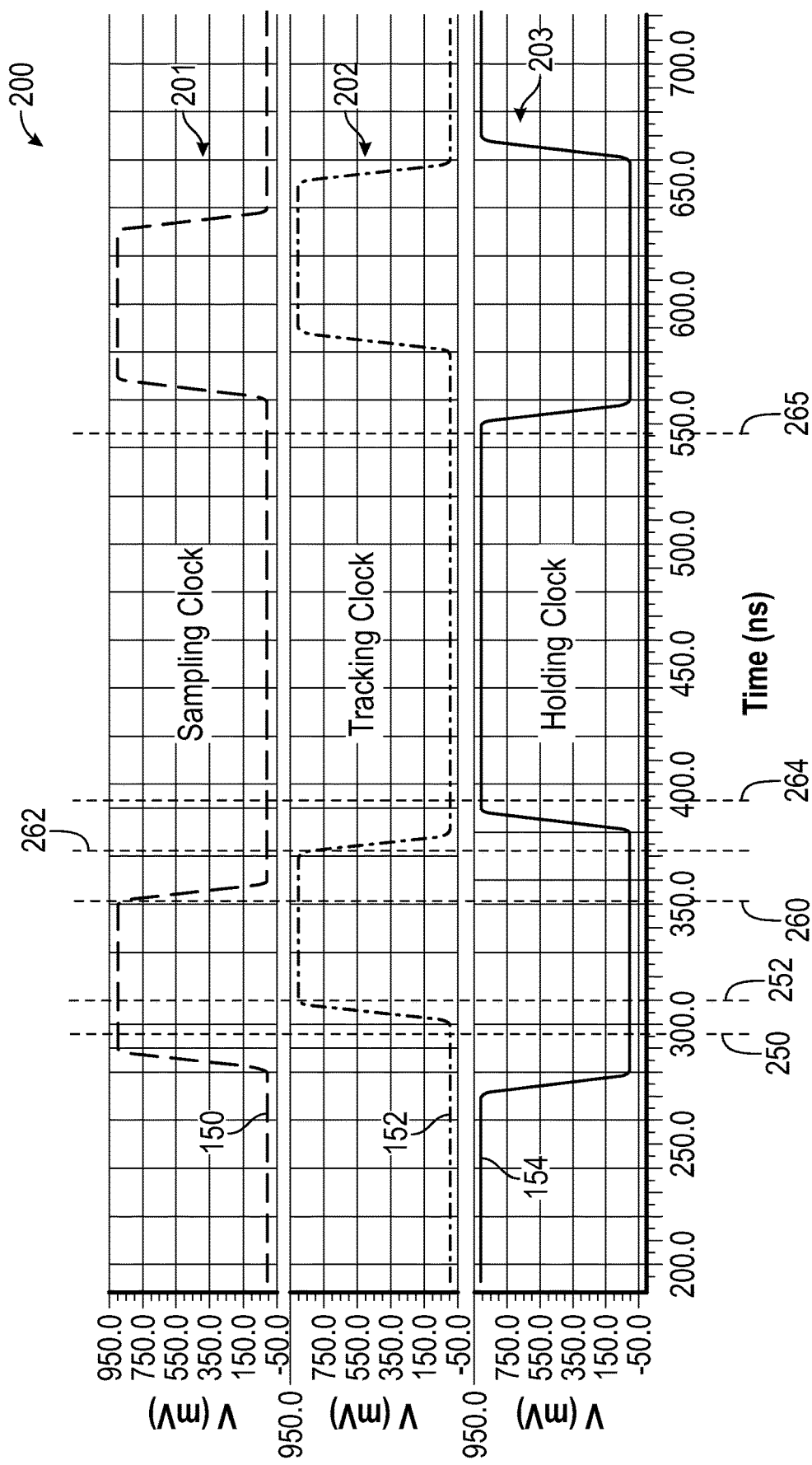
FIG. 2 illustrates a timing signal scheme for a sample and hold circuit, in accordance with an embodiment of the disclosure.

FIG. 2 illustrates a clock signal timing scheme for a sample and hold circuit, in accordance with an embodiment of the disclosure. The scheme 200 includes top plot 201 illustrating a timing diagram of the sampling clock signal 150. Middle plot 202 illustrates a timing diagram of the tracking clock signal 152 and bottom plot 203 illustrates a timing diagram of the holding clock signal 154. In general, the sampling clock signal 150 should lead the tracking clock signal 152, in some examples, the relation between sampling/tracking and holding clocks is non-overlapping complementary.

At a first clock time, such as time 250, the sampling clock signal 150 turns high (active). For example, any switches in the amplifier 110 or system 100 associated with the sampling clock signal 150 are closed, providing a connection across the switches associated with the sampling clock signal 150. At time 252, after the time 250, the tracking clock signal 152 turns active. For example, any switches in the amplifier 110 or system 100 associated with the tracking clock signal 152 are closed, providing a connection across these switches. In some examples, from time 252 to time 260, the amplifier 110 is in a tracking mode.

At time 260, the amplifier 110 samples the current value of the input signal. For example, at time 260 the sampling clock signal 150 turns low and opens any switches in the amplifier 110 or system 100 associated with the sampling clock signal 150, which disconnects any associated connections. After time 260 the amplifier 110 begins a process to enter a holding mode. For example, at time 262 the tracking clock signal 152 turns low and any switches in the amplifier 110 or system 100 associated with the tracking clock signal 152 are opened, which disconnects any associated connections. In some examples, the non-overlapping tracking and holding clocks do not allow the output nodes of amplifier 110 to be coupled to the input nodes, INP 112 and INN 114, thru the associated switches, thus preventing corruption of the circuit input signal during the transition in the circuitry from the tracking mode to the holding mode.

At time 264, the holding clock signal 154 is active and any switches in the amplifier 110 or system 100 associated with the holding clock signal are closed providing a connection across the switch, enabling the holding mode. The holding mode continues until time 265 where the holding clock signal 154 turns low and the process from times 250-262 repeats. The various switches and other components in the amplifier 110, under a tracking mode and a holding mode are shown in more detail in relation to FIGS. 3 and 4.

Figure 3:
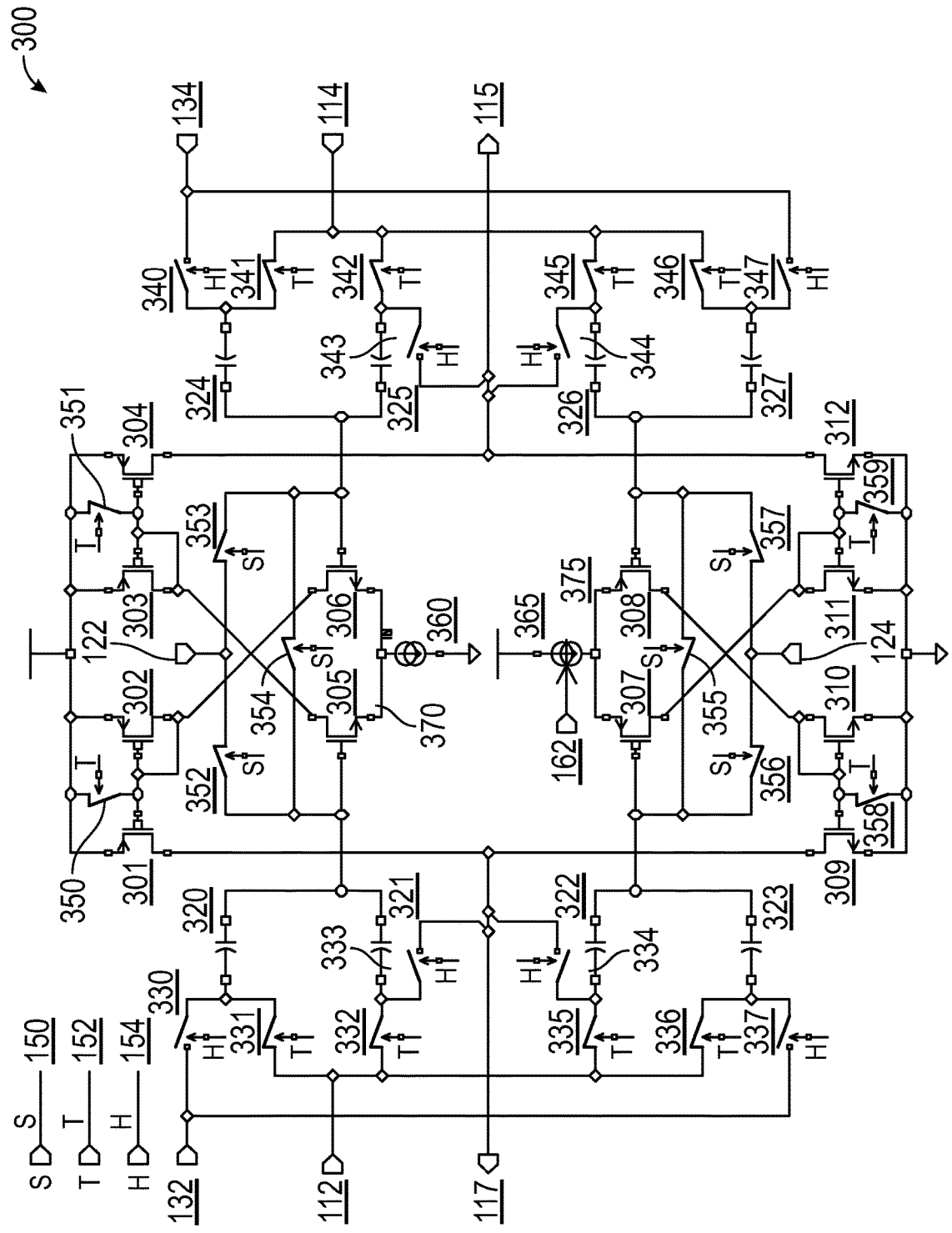
FIG. 3 illustrates a sample and hold amplifier circuit diagram in a tracking mode, in accordance with an example embodiment of the disclosure.

FIG. 3 illustrates a sample and hold amplifier 110 circuit diagram in a tracking mode, in accordance with an example embodiment of the disclosure. Arrangement 300 includes an example circuit diagram of the amplifier 110 in a tracking mode of operation. The amplifier 110 is configured to perform operations to enter the tracking mode including shunting together the gate nodes of an NMOS transistor differential stage and shunting together the gate nodes of a PMOS transistor differential stage using a first set of switches, coupling together top plates from a set of sampling capacitors to at least one input node of the sample and hold amplifier, where bottom plates of the set of sampling capacitors are connected to different gates of NMOS transistor and PMOS transistor differential input stages. The amplifier also disables a first set of PMOS current mirrors driven by a differential input NMOS transistor stage and disables a first set of NMOS current mirrors driven by a differential input PMOS transistor stage. These operations are described in more detail herein.

For example, the amplifier 110 includes two CMOS differential input stages including a differential input NMOS transistor stage 370 and a differential input PMOS transistor stage 375. The NMOS transistor stage 370 includes NMOS transistors 305 and 306 and invariant current source 360. The PMOS transistor stage 375 includes PMOS transistors 307 and 308 and a controlled tail current source 365. In some examples, the controlled tail current source 365 provides a control path for the VCMC 162 from the circuit 160 described in more detail in relation to FIG. 4. In some examples, a source node of a first PMOS transistor and a source node of a second PMOS transistor are coupled to the invariant current source, and the source node of a first NMOS transistor and a source node of a second NMOS transistor are coupled to a controlled current source. In some examples, the controlled current source controls an amplifier output common mode during a tracking mode of operation.

The NMOS stage 370 and the PMOS stage 375 drive two pairs of current mirrors connected in a differential push-pull configuration. For example, the NMOS stage 370 drives two PMOS transistor current mirrors, which include PMOS transistors, such as transistors 301, 302, 303, and 304 having the gate nodes connected to the drain nodes of the NMOS transistors of the input differential stage 370. The PMOS stage 375 drives two NMOS transistor current mirrors, which include NMOS transistors, such as transistors 309, 310, 311, and 312 having the gate nodes connected to the drain nodes of the PMOS stage 375. In some examples, during the tracking mode illustrated in FIG. 3, the current mirrors are disabled by switches 350, 351, 358, and 359. In some examples, the disabled switch places the amplifier outputs, OUP 115 and OUN 117 in a high impedance mode.

In some examples, the four input nodes of the differential stages, the NMOS stage 370 and the PMOS stage 375, are directly connected to respective bottom plates of four pairs of sampling capacitors. For example, the gate nodes of transistors 305, 306, 307, and 308 are coupled to the bottom plates of sampling capacitors 320, 321, 322, 323, 324, 325, 326, 327. In some examples, the NMOS stage 370 and the PMOS stage 375 are also coupled to the respective bias voltages, VCMGN 122 and VCMGP 124, by closing the switches 352, 353, 356, and 357. In some examples, the switches may have associated minimal size. In some examples, the gate nodes of the PMOS transistor input differential stage and the bottom plates of capacitors are coupled to a first source of bias voltage via a first switch, the gate node of the NMOS transistor input differential stage and the bottom plates of the associated sampling capacitors are coupled to a second source of bias voltage via a second switch. During the tracking mode, the gate nodes of the NMOS stage and the PMOS stage are coupled to different sources of a bias voltage.

In some examples, in the tracking mode of FIG. 3, the input nodes of the NMOS stage 370 are shunted to each other by closing the switches 354 and the input nodes of the PMOS stage 375 are additionally shunted to each other by closing the switch 355, which reduce the combined switch impedance and increase the bandwidth of the system 100.

Additionally, during the tracking mode top plates of the sampling capacitors, capacitors 320, 321, 322, 323, 324, 325, 326, 327, are coupled to the respective input nodes of the sample and hold amplifier 110. For example, capacitors 320, 321, 322, 323, and coupled to the INP 112 via closed switches such as switches 331, 332, 335, and 336. The capacitors 324, 325, 326, and 327 are coupled to the INN 114 via closed switches such as switches 341, 342, 345 and 346.

In this example tracking mode, the voltage across the sampling capacitors tracks the input signals, INP 112 and INN 114, applied to input nodes. The control clock signals of the switches shown in FIG. 3 are indicated at the control nodes of all switches and correspond to the sampling clock signal 150 (S in FIGS. 3 and 4), tracking clock signal 152 (T in FIGS. 3 and 4), and holding clock signal 154 (H in FIGS. 3 and 4).

At the end of a tracking mode of the amplifier 110, switches controlled by the sampling clock signal 150 are turned off at a first time, such as time 260 shown in FIG. 2, after which switches controlled by tracking clock signal 152 are also turned off at a second time (e.g., time 262 shown in FIG. 2). For example, at the time 260, the switches 352, 353, 354, 355, 356, and 357 are switched open. At the time 262, the switches 331, 332, 335, 336, 341, 342, 345, 346, 350, 351, 358, and 359, are switched open and the amplifier 110 exits the tracking mode. After disabling switches operating in the tracking mode, the holding clock signal 154 enables the holding mode of operation of the sample and hold amplifier 110 at a third time, such as the time 264 shown in FIG. 2. The holding mode is described in more detail in relation to FIG. 4

Figure 4:
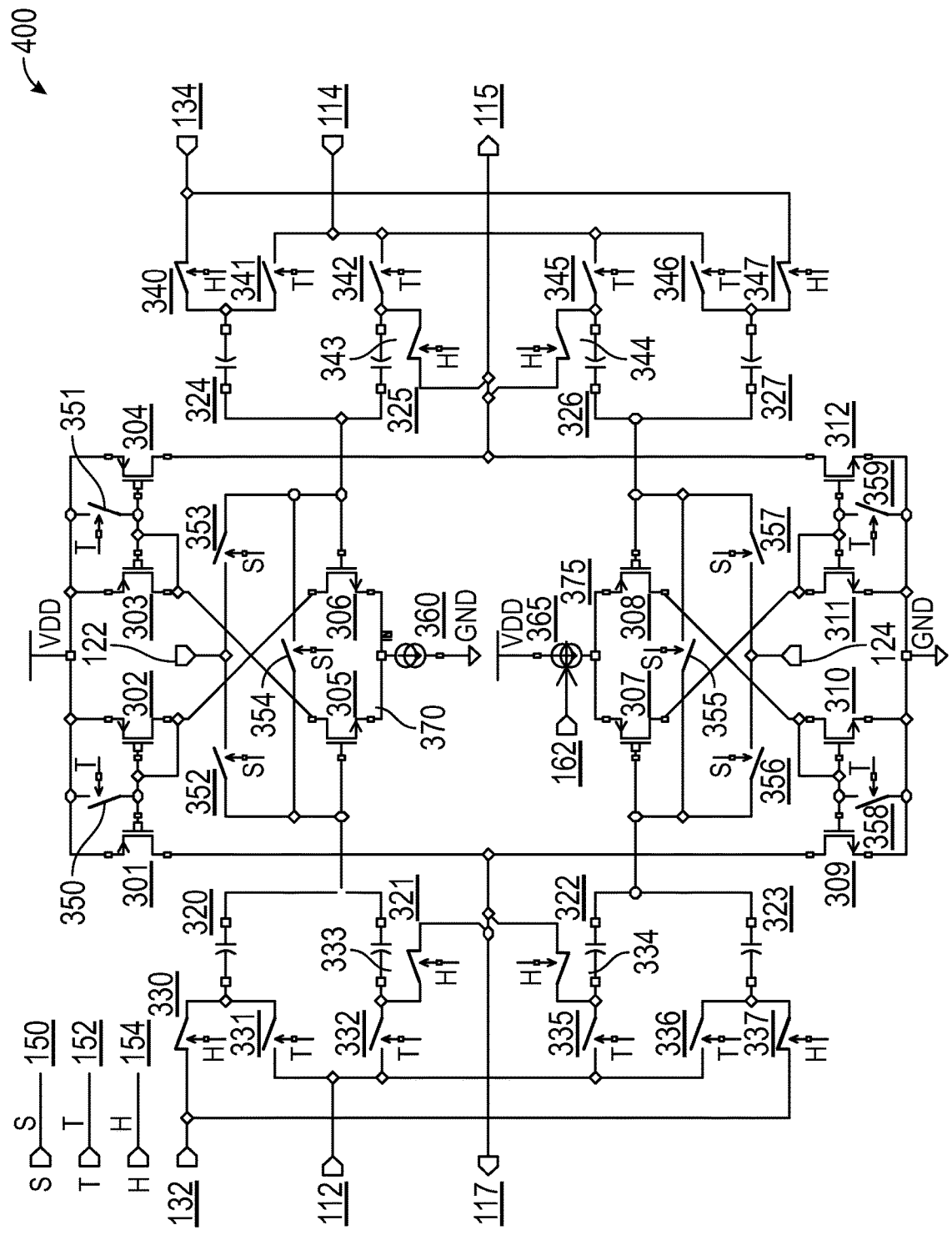
FIG. 4 illustrates a sample and hold amplifier circuit diagram in a holding mode, in accordance with an example embodiment of the disclosure.

FIG. 4 illustrates a sample and hold amplifier 110 circuit diagram in a holding mode, in accordance with an example embodiment of the disclosure. The arrangement 400 of the sample and hold amplifier 110 is in a holding mode of operation. In some examples, at time 264 in FIG. 2, the amplifier 110 enables a holding mode by disconnecting the set of sampling capacitors from at least one input node and coupling a subset of the of sampling capacitors to at least one output of the sample and hold amplifier, and enabling the PMOS and NMOS current mirrors to provide a holding output signal, as described in further detail herein.

In the holding mode all four current mirrors described in relation to FIG. 3 are enabled, which enables the amplifier 110 to produce a valid differential output. In some examples, four out of eight sampling capacitors (e.g., the capacitors 321, 322, 325, and 326) are coupled to the outputs, OUP 115 and OUN 117, by respective switches 343, 344, 333, and 334. This coupling, the first set of sampling capacitors to the outputs, OUP 115 and OUN 117, provides the holding action of the amplifier 110.

In some examples, a second set of sampling capacitors, (i.e., the other four capacitors including capacitors 320, 323, 324, 327) are coupled to the offset compensation inputs VOFFP 132 and VOFFN 134 by respective switches 330, 337, 340, and 347. In this example, while in the holding mode in arrangement 400, the gain value of the sample and hold amplifier 110 becomes greater than 1, thus, an extended signal swing of the output signal can be greater than signal swing of the input signal. In some examples, the output signal swing may include ranges equivalent to a rail-to rail output signal swing.

In some examples, the compensation inputs VOFFP 132 and VOFFN 134 are generated by an offset compensation DAC 130, as described in FIG. 1, which controls the offset voltage of the sample and hold amplifier. In some examples, a voltage value generated by the at least one voltage source to which the second subset of the sampling capacitors is coupled in the holding mode, is different from the input common mode voltage of the sample and hold amplifier to facilitate a control of an amplifier output common mode voltage in holding mode.

In some examples, common mode voltage value at compensation inputs VOFFP 132 and VOFFN 134 may be different from the common mode voltage of the input signal(s) for the sample and hold amplifier 110. The common mode voltage difference facilitates shifting the output common mode voltage to the power supply midpoint in holding mode of operation providing the extended output signal swing. In some examples, in the holding mode the sampling capacitors of the second subset are connected to different voltage sources to compensate an offset voltage of the sample and hold amplifier. A common mode voltage generated by different voltage sources is different from an input common mode voltage of the sample and hold amplifier to facilitate a control of an amplifier output common mode voltage.

Figure 5:
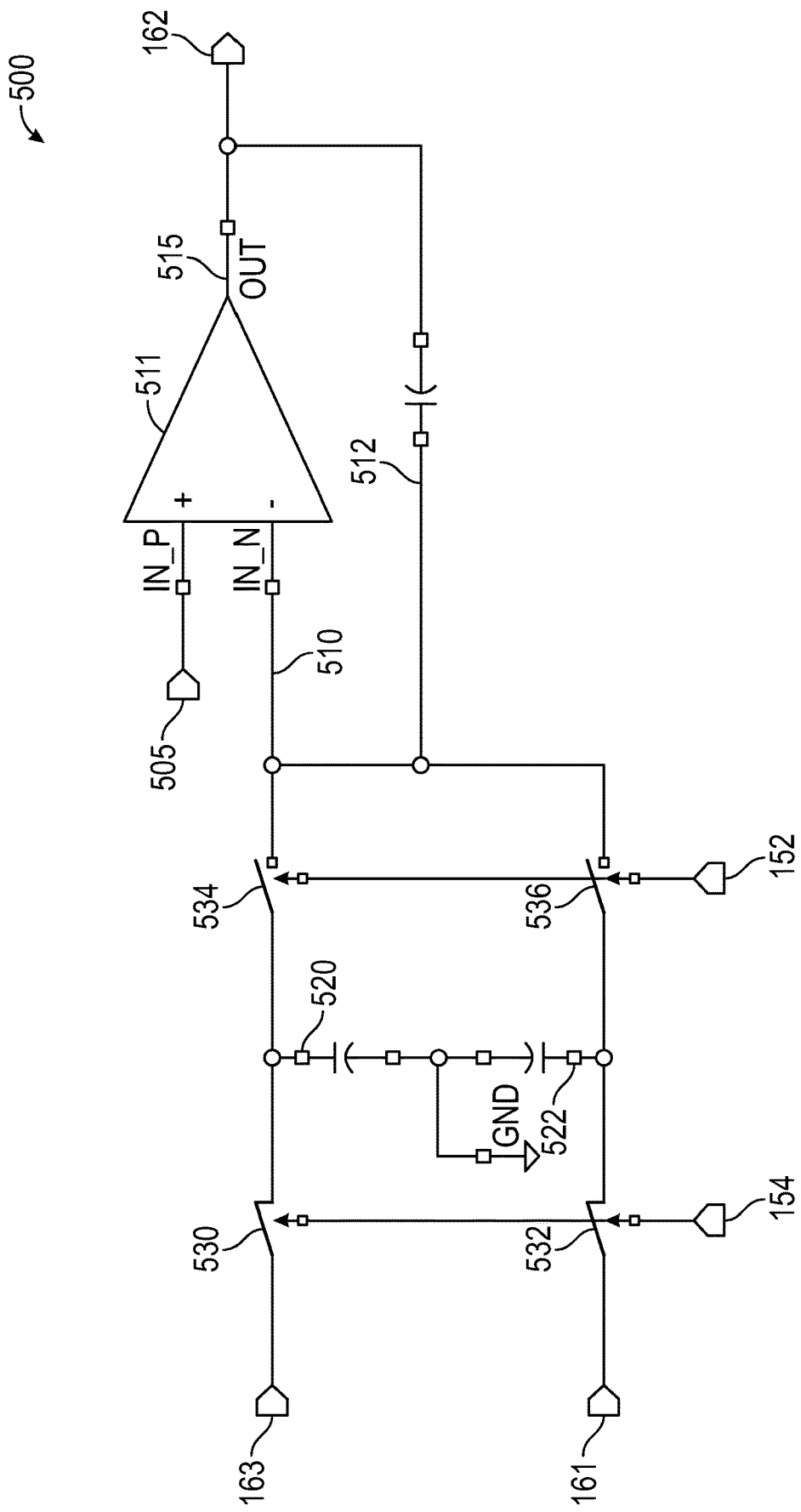
FIG. 5 illustrates an output common mode voltage control circuit for a sample and hold amplifier, in accordance with an example embodiment of the disclosure.

FIG. 5 illustrates an output common mode voltage control circuit for a sample and hold amplifier, in accordance with an example embodiment of the disclosure. As shown in FIG. 1, the system 100 includes circuit 160 associated with the sample and hold amplifier 110. An example of a switched capacitor common mode control circuit is illustrated by circuit 500 in FIG. 5. In some examples, in circuit 500, at the end of the holding mode, such as at time 265 in FIG. 2, capacitors 520 and 522 sample the values of the sample and hold amplifier outputs SnH_OUTP 163 and SnH_OUTN 161 shown in FIG. 1. In some examples, switches 530 and 532 are closed during the holding mode of operation to enable tracking the output voltages of the sample and hold amplifier, and at the end of holding mode, switches 530 and 532 are turned off to enable output voltages sampling the at the capacitors 520 and 522.

In some examples, during the tracking mode, such as the tracking mode shown in FIG. 3, capacitors 520 and 522 transfer charges in the capacitors to the input node of an integrator 510 through switches 534 and 536 in a closed mode (not shown in FIG. 5). In some examples, the difference of the charge associated with the differential output signal of the sample and hold amplifier 110, sampled by capacitors 520 and 522, is cancelled because the sum of both charges is transferred to integrator 510 input node. In this example, only the charge associated with the common mode voltage is accumulated by integrator 510. In some examples, the integrator 510 includes an operational amplifier 511 and a capacitor 512. The output 515 of the integrator 510 is coupled to the common mode control pin, VCMC 162, of sample and hold amplifier 110 as shown in FIGS. 1, 3, and 4.

In some examples, if the output common mode voltage of sample and hold amplifier 110 is different from the reference voltage VCM_REF 505, a charge proportional to the voltage difference is transferred to integrator 510, changing a voltage value stored by capacitor 512. If the output common mode voltage and reference voltage VCM_REF 505 are equal, thus no charge is transferred and the output voltage of the integrator 510 is unchanged.

Figure 6:
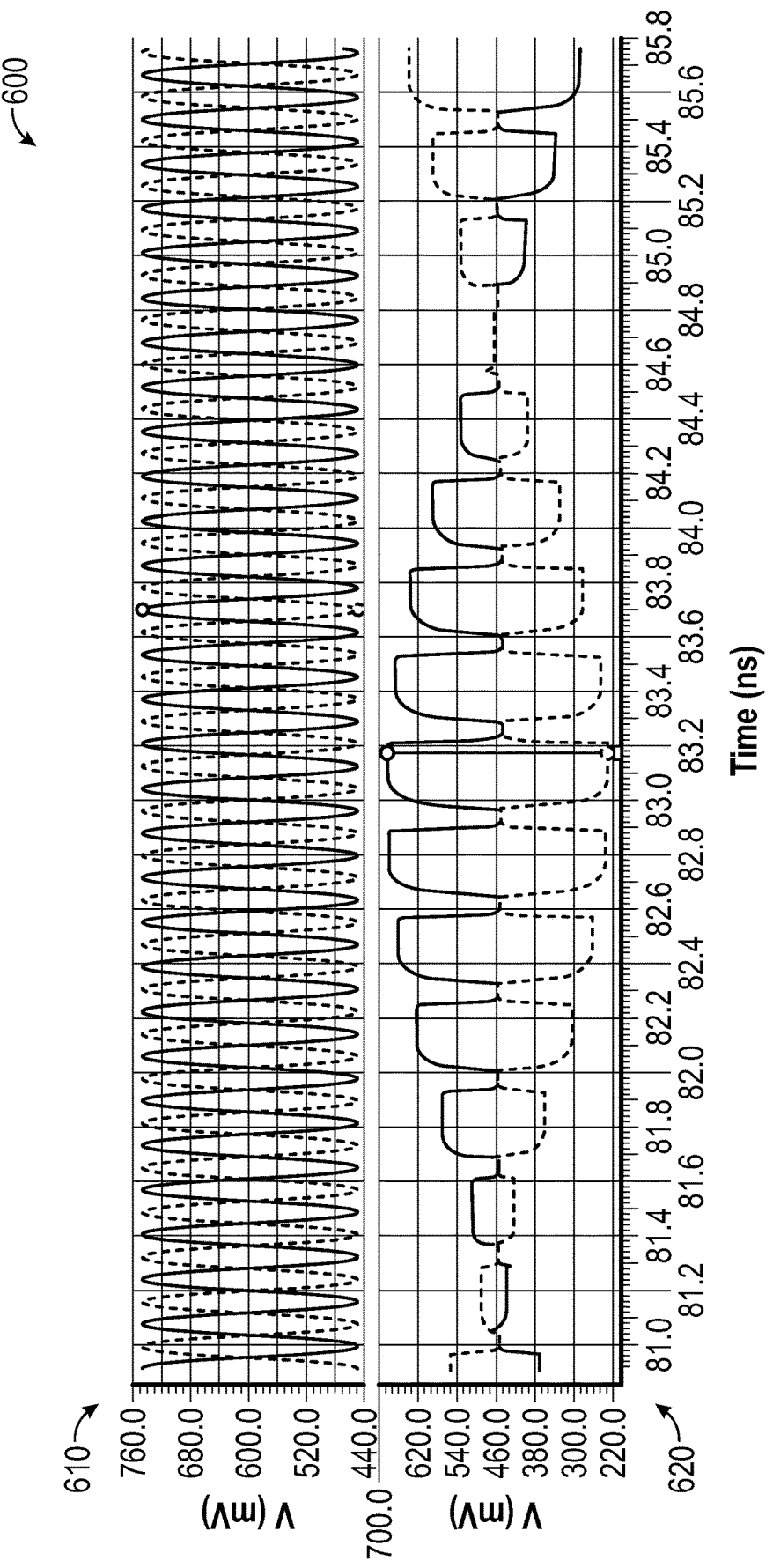
FIG. 6 illustrates continuous time differential input voltage and sampled differential output voltage for a sample and hold amplifier with a switched capacitor feedback loop, in accordance with an example embodiment of the disclosure.

FIG. 6 illustrates continuous time high frequency input differential voltage and sampled output differential voltage for a sample and hold differential amplifier, in accordance with an example embodiment of the disclosure. The waveforms 600 are produced using for example 0.9V power supply voltage. The top plot 610 depicts input signals to sample and hold amplifier 110. In some examples, the common mode voltage of the input signal is 0.6V, that is 150 mV above the midpoint of the power supply. In some examples, the shift is typical for an NMOS transistor differential CML stage that can be used as a driver for such sample and hold amplifier. The swing of the input signal is 600 m Vp-p differential. The output sampled signal is depicted in the bottom plot 620. The common mode voltage of the output signal is a half of the power supply voltage, and the output signal swing is 900 m Vp-p differential achieving 50% increase of the sampled signal output signal swing.

This common mode voltage of the input signal might be shifted with respect to the midpoint of the power supply while the common mode voltage of the output signal is approximately equal to the half of the power supply voltage. The difference in the common mode voltage and increased output voltage output signal swing is achieved with additional set of four capacitors, which are also split between PMOS and NMOS transistor input stages as described in relation to FIGS. 3 and 4.

I claim:

1. A circuit for sampling and holding electrical signals comprising:
    a sample and hold amplifier comprising:
        a first input node;
        a first output node;
        at least two capacitors, where each capacitor of the at least two capacitors comprises a bottom plate and a top plate, where each respective top plate is coupled to the first input node and the first output node;
    a first PMOS transistor comprising:
        a gate node connected to a bottom plate of a first capacitor of the at least two capacitors; and
        a drain node coupled to an input node of a first current mirror, where an output of the first current mirror is coupled to a second output node of the sample and hold amplifier; and
    a first NMOS transistor comprising:
        a gate node connected to a bottom plate of a second capacitor of the at least two capacitors; and
        a drain node coupled to an input node of a second current mirror, where an output of the second current mirror is coupled to the second output node of the sample and hold amplifier.

2. The circuit of claim 1, wherein the gate node of the first PMOS transistor and the bottom plate of the first capacitor are coupled to a first source of bias voltage via a first switch, and wherein the gate node of the first NMOS transistor and the bottom plate of the second capacitor are coupled to a second source of bias voltage via a second switch.

3. The circuit of claim 1, further comprising:
    at least two additional capacitors, wherein each respective capacitor of the at least two additional capacitors comprises:
    a bottom plate connected to a respective bottom plate of one of the at least two capacitors; and
    a top plate coupled to at least one voltage source and coupled to the first input node of the sample and hold amplifier.

4. The circuit of claim 1, wherein the first current mirror and the second current mirror are disabled during a tracking mode of operation of the circuit.

5. The circuit of claim 1, wherein the sample and hold amplifier further comprises:
    a second input node;
    at least two additional capacitors,
        wherein each capacitor of the at least two additional capacitors comprises a top plate, where each respective top plate is coupled to the second input node and the second output node; and
    wherein the circuit further comprises:
        a second PMOS transistor comprising:
            a source node coupled to a source node of the first PMOS transistor;
            a gate node connected to the bottom plate of a first capacitor of the at least two additional capacitors; and
            a drain node coupled to an input node of a third current mirror, wherein an output of the third current mirror is coupled to the first output node; and
        a second NMOS transistor comprising:
            a source node coupled to a source node of the first NMOS transistor;
            a gate node connected to a bottom plate of a second capacitor of the at least two additional capacitors; and
            a drain node coupled to an input node of a fourth current mirror, wherein an output of the fourth current mirror is coupled to the first output node.

6. The circuit of claim 5, wherein the gate node of the first PMOS transistor and the gate node of the second PMOS transistor are coupled together with a first switch, wherein the first switch is closed during a tracking mode of operation of the circuit, wherein the first switch is open during a holding mode of operation of the circuit, and
    wherein the gate node of the first NMOS transistor and the gate node of the second NMOS transistor are coupled together with a second switch, wherein the second switch is closed during the tracking mode, and wherein the second switch is open during the holding mode.

7. The circuit of claim 5 further comprising:
    a set of four additional capacitors, wherein each capacitor of the set of four additional capacitors comprises:
        a bottom plate connected to the bottom plate of a respective one of the at least two capacitors and the at least two additional capacitors; and
        a top plate coupled to an input node and coupled to at least one voltage source.

8. The circuit of claim 7, wherein each respective top plate of the set of four additional capacitors is coupled to one of two different voltage sources.

9. The circuit of claim 7, wherein a voltage value produced by the voltage source is different from an amplifier input common mode voltage.

10. The circuit of claim 5, wherein the source node of the first PMOS transistor and the source node of the second PMOS transistor are coupled to an invariant current source, and wherein the source node of the first NMOS transistor and the source node of the second NMOS transistor are coupled to a controlled current source, and wherein the controlled current source controls an amplifier output common mode during a tracking mode of operation.

11. The circuit of claim 5, wherein the source node of the first NMOS transistor and the source node of the second NMOS transistor are coupled to an invariant current source, wherein the source node of the first PMOS transistor and the source node of the second PMOS transistor are coupled to a controlled current source, and wherein the controlled current source controls an amplifier output common mode during a tracking mode of operation of the circuit.

12. A method for sampling and holding an electrical signal:
    at first time enabling a tracking mode in a sample and hold amplifier by:
        shunting together gate nodes of an NMOS transistor differential stage and shunting together gate nodes of a PMOS transistor differential stage using a first set of switches;

coupling together top plates from a set of sampling capacitors to at least one input node of the sample and hold amplifier, where bottom plates of the set of sampling capacitors are connected to different gate nodes of the NMOS and PMOS transistor differential stages;

disabling a first set of PMOS current mirrors driven by the NMOS transistor differential stage; and disabling a first set of NMOS current mirrors driven by the PMOS transistor differential stage; and at second time enabling a holding mode in the sample and hold amplifier by:

opening the first set of switches and second set of switches, disconnecting the set of sampling capacitors from the at least one input node;

enabling the first set of PMOS current mirrors;

enabling the first set of NMOS current mirrors;

coupling a first subset of the first set of sampling capacitors to at least one output of the sample and hold amplifier to provide a holding output signal; and coupling a second subset of the sampling capacitors to at least one voltage source.

13. The method of claim 12, wherein during the tracking mode, the gate nodes of the NMOS transistor differential stage and the gate nodes of the PMOS transistor differential stage are coupled to different sources of a bias voltage.

14. The method of claim 12, wherein a voltage value generated by the at least one voltage source, to which the second subset of the sampling capacitors is connected in the holding mode, is different from an input common mode voltage of the sample and hold amplifier to facilitate a control of an amplifier output common mode voltage in holding mode.

15. The method of claim 12, wherein in the holding mode, the sampling capacitors of the second subset are connected to different voltage sources to compensate an offset voltage of the sample and hold amplifier.

16. The method of claim 15, wherein a common mode voltage generated by different voltage sources is different from an input common mode voltage of the sample and hold amplifier to facilitate a control of an amplifier output common mode voltage.

17. A circuit for sampling and holding electrical signals comprising:

a sample and hold amplifier;

a PMOS transistor differential stage; and an NMOS transistor differential stage, the circuit configured to perform a method comprising:

at first time enabling a tracking mode in the sample and hold amplifier by:

shunting together gate nodes of the NMOS transistor differential stage and shunting together gate nodes of the PMOS transistor differential stage using a first set of switches;

coupling together top plates from a set of sampling capacitors to at least one input node of the sample and hold amplifier, where bottom plates of the set of sampling capacitors are connected to different gate nodes of the NMOS and PMOS transistor differential stages;

disabling a first set of PMOS transistor current mirrors driven by the NMOS transistor differential stage; and disabling a first set of NMOS transistor current mirrors driven by the PMOS transistor differential stage; and at second time enabling a holding mode in the sample and hold amplifier by:

opening the first set of switches, disconnecting the set of sampling capacitors from the at least one input node;

enabling the first set of PMOS transistor current mirrors;

enabling the first set of NMOS transistor current mirrors;

coupling a first subset of the first set of sampling capacitors to at least one output of the sample and hold amplifier to provide a holding output signal; and coupling a second subset of the sampling capacitors to at least one voltage source.

18. The circuit of claim 17, wherein during the tracking mode, the gate nodes of the PMOS transistor differential stage and the gate nodes of the NMOS transistor differential stage are coupled to different sources of bias voltage.

19. The circuit of claim 17, wherein a voltage value generated by the at least one voltage source, to which the second subset of the sampling capacitors is connected to in the holding mode, is different from an input common mode voltage of the sample and hold amplifier to facilitate a control of an amplifier output common mode voltage in the holding mode.

* * * * *